United States Patent
Zhu

(10) Patent No.: US 11,276,769 B2
(45) Date of Patent: Mar. 15, 2022

(54) SEMICONDUCTOR DEVICE AND METHOD OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 178 days.

(21) Appl. No.: 16/310,713

(22) PCT Filed: Jun. 27, 2016

(86) PCT No.: PCT/CN2016/087284
§ 371 (c)(1),
(2) Date: Dec. 17, 2018

(87) PCT Pub. No.: WO2017/215025
PCT Pub. Date: Dec. 21, 2017

(65) Prior Publication Data
US 2019/0267466 A1    Aug. 29, 2019

(30) Foreign Application Priority Data
Jun. 17, 2016 (CN) .......................... 201610438781.1

(51) Int. Cl.
*H01L 27/11521* (2017.01)
*H01L 29/66* (2006.01)
(Continued)

(52) U.S. Cl.
CPC .......... *H01L 29/6681* (2013.01); *H01L 21/02* (2013.01); *H01L 27/06* (2013.01);
(Continued)

(58) Field of Classification Search
CPC ........... H01L 27/10826; H01L 29/7851; H01L 27/1211; H01L 29/0649; H01L 29/161;
(Continued)

(56) References Cited

U.S. PATENT DOCUMENTS

| 8,134,209 B2* | 3/2012 | Yagishita | H01L 29/66795 257/347 |
| 8,753,942 B2* | 6/2014 | Kuhn | H01L 29/0673 438/285 |

(Continued)

FOREIGN PATENT DOCUMENTS

| CN | 101038923 A | 9/2007 |
| CN | 105633167 A | 6/2016 |

(Continued)

*Primary Examiner* — Mary A Wilczewski
*Assistant Examiner* — Tsz K Chiu
(74) *Attorney, Agent, or Firm* — Christensen, Fonder, Dardi & Herbert PLLC

(57) ABSTRACT

A method of manufacturing a semiconductor device may include: forming a fin-shaped structure on a substrate; forming a supporting layer on the substrate having the fin-shaped structure formed thereon, and patterning the supporting layer into a supporting portion extending from a surface of the substrate to a surface of the fin-shaped structure and thus physically connecting them; removing a portion of the fin-shaped structure close to the substrate to form a first semiconductor layer spaced apart from the substrate; growing a second semiconductor layer with the first semiconductor layer as a seed layer; and in at least a fraction of the longitudinal extent, removing the first semiconductor layer, and cutting off the second semiconductor layer on sides of the first semiconductor layer away from the substrate and close to the substrate, respectively, so that the cut-off second semiconductor layer acts as a fin of the device.

17 Claims, 16 Drawing Sheets

(51) Int. Cl.
 *H01L 27/088* (2006.01)
 *H01L 29/04* (2006.01)
 *H01L 29/78* (2006.01)
 *H01L 21/02* (2006.01)
 *H01L 27/06* (2006.01)

(52) U.S. Cl.
 CPC ........ *H01L 27/0886* (2013.01); *H01L 29/045* (2013.01); *H01L 29/6653* (2013.01); *H01L 29/785* (2013.01)

(58) Field of Classification Search
 CPC ............. H01L 29/6681; H01L 29/6653; H01L 29/0673; H01L 29/0676; H01L 29/1033; H01L 29/42392; H01L 21/76224; H01L 29/78696; H01L 29/66439; H01L 29/66545; H01L 29/775; H01L 29/66742; H01L 21/823431; H01L 21/823821; H01L 21/845; H01L 27/0886; H01L 27/0924; H01L 27/10879; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365
 See application file for complete search history.

(56) References Cited

U.S. PATENT DOCUMENTS

| | | | |
|---|---|---|---|
| 9,129,829 B2* | 9/2015 | Kuhn | H01L 29/1033 |
| 9,425,291 B1* | 8/2016 | Balakrishnan | H01L 29/0673 |
| 9,704,861 B2* | 7/2017 | Ching | H01L 29/1033 |
| 9,865,504 B2* | 1/2018 | Lee | H01L 21/3081 |
| 2004/0108559 A1* | 6/2004 | Sugii | H01L 29/78687 257/411 |
| 2007/0045736 A1* | 3/2007 | Yagishita | H01L 29/045 257/347 |
| 2007/0284648 A1 | 12/2007 | Park et al. | |
| 2012/0138886 A1* | 6/2012 | Kuhn | H01L 29/775 257/9 |
| 2015/0294973 A1 | 10/2015 | Cheng et al. | |
| 2016/0268376 A1* | 9/2016 | Shih | H01L 29/78684 |
| 2016/0276357 A1* | 9/2016 | Su | H01L 29/0847 |
| 2018/0277682 A1* | 9/2018 | Zhu | H01L 29/42392 |
| 2018/0301384 A1* | 10/2018 | Ching | H01L 27/1211 |

FOREIGN PATENT DOCUMENTS

| | | |
|---|---|---|
| JP | 2001-005197 A | 1/2001 |
| KR | 10-2005-0078145 A | 8/2005 |

\* cited by examiner

SEMICONDUCTOR DEVICE AND METHOD OF MANUFACTURING THE SAME

CROSS REFERENCE TO RELATED APPLICATIONS

This application is a U.S. national phase application of PCT Application No. PCT/CN2016/087284, filed on Jun. 27, 2016, entitled "SEMICONDUCTOR DEVICE AND METHOD OF MANUFACTURING THE SAME," which claimed priority to Chinese Patent Application No. 201610438781.1. Both the PCT Application and the Chinese Application are incorporated herein by reference in their entireties.

TECHNICAL FIELD

The present disclosure relates to the field of semiconductors, and more particularly, to a semiconductor device and a method of manufacturing the same.

BACKGROUND

With the development of semiconductor devices, it is desirable to manufacture high-performance semiconductor devices such as Metal-Oxide-Semiconductor Field-Effect Transistors (MOSFETs) with a semiconductor material of higher mobility than that of silicon (Si). However, it is difficult to form a high-quality semiconductor material of high mobility.

SUMMARY

In view of the above, the present disclosure aims to provide, among others, a semiconductor device having a high-quality epitaxial layer and a method of manufacturing the same.

According to an aspect of the present disclosure, there is provided a method of manufacturing a semiconductor device, comprising: forming a fin-shaped structure on a substrate; forming a supporting layer on the substrate having the fin-shaped structure formed thereon, and patterning the supporting layer into a supporting portion extending from a surface of the substrate to a surface of the fin-shaped structure and thus physically connecting the fin-shaped structure to the substrate; removing a portion of the fin-shaped structure close to the substrate to form a first semiconductor layer spaced apart from the substrate; growing a second semiconductor layer with the first semiconductor layer as a seed layer; and in at least a fraction of the longitudinal extent, removing the first semiconductor layer, and cutting off the second semiconductor layer on a side of the first semiconductor layer away from the substrate and on a side of the first semiconductor layer close to the substrate, so that the cut-off second semiconductor layer acts as a fin of the semiconductor device.

According to another aspect of the present disclosure, there is provided a semiconductor device, comprising: a substrate; at least two fins spaced apart from the substrate, wherein at least a pair of adjacent ones of the at least two fins are arranged in a direction substantially parallel to a surface of the substrate, are spaced apart from each other, extend substantially parallel to each other, and are substantially mirror-symmetrical in the crystal structure with respect to a central line therebetween; an isolation layer formed on the substrate and exposing the respective fins; and a gate stack formed on the isolation layer to intersect the respective fins.

According to embodiments of the present disclosure, the second semiconductor layer can be grown with the (thin) first semiconductor layer suspended relative to the substrate as a seed layer. The second semiconductor layer can have high mobility. Such a suspended seed layer can enable relaxation of stresses in the first semiconductor layer and the second semiconductor layer, thereby contributing to suppress defects in the first semiconductor layer or the second semiconductor layer. Then, the first semiconductor layer can be removed, and the second semiconductor layer can act as a fin of the device.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
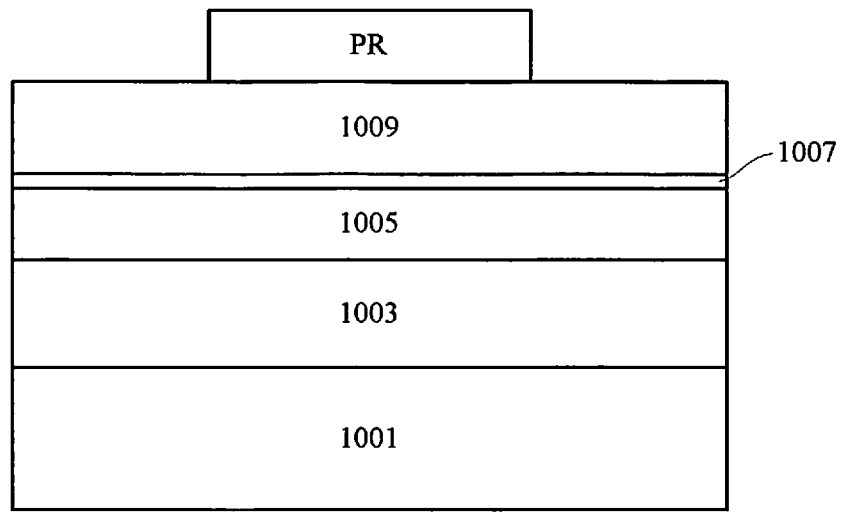
FIGS. 1-21(*b*) are schematic views showing a flow of manufacturing a semiconductor device according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device having a suspended fin structure. In particular, the device has a fin suspended relative to a substrate. Here, the so-called "suspended" refers to that the fin is spaced apart from the substrate. It is to be noted that a spacing between the fin and the substrate may be filled with another material (for example, an isolation layer). The fin may comprise a semiconductor material of high mobility, to improve performances of the device. Here, the so-called "high mobility" refers to higher mobility than that of silicon (Si). The semiconductor material of high mobility comprises, for example, Ge, SiGe, a III-V compound semiconductor, or the like.

The fin may be a second semiconductor layer formed (for example, epitaxially grown) on a first semiconductor layer above and spaced apart from the substrate. The first semiconductor layer may be in a fin shape which is suspended relative to the substrate. Then, the second semiconductor layer may be formed to at least partially surround a periphery of the first semiconductor layer. Here, the so-called "partially surround(ing)" refers to that there may be an extent of the first semiconductor layer in the longitudinal extending direction thereof in which the second semiconductor layer can completely enclose an external surface of the first semiconductor layer. That is, in this extent, the second semiconductor layer may form a closed pattern in a cross section perpendicular to the longitudinal extending direction of the first semiconductor layer (for example, a rectangle, a polygon or the like corresponding to a shape of the cross section of the first semiconductor layer). Of course, the first semiconductor layer may have its surface, other than those covered by a supporting portion, covered by the second semiconductor layer. The first semiconductor layer may be relatively thin (for example, with a thickness of about 3-20 nm) and is suspended relative to the substrate. In this way, stresses in the first semiconductor layer and the second semiconductor layer can be relaxed in the growth process, and therefore it is possible to suppress or avoid defects occurring in the first semiconductor layer or the second semiconductor layer.

In order to further reduce the defects, a transition layer may firstly be grown on the first semiconductor layer, and then the second semiconductor layer may be grown on the transition layer. The transition layer may have a lattice constant which gradually changes (for example, by a change in components of the transition layer), for example, from a lattice constant equal to or close to that of the first semiconductor layer to a lattice constant equal to or close to that of the second semiconductor layer. As described above, the transition layer may be formed to at least partially surround the periphery of the first semiconductor layer, and the second semiconductor layer may be formed to at least partially surround a periphery of the transition layer.

According to an embodiment of the present disclosure, the first semiconductor layer (and the transition layer, if present) may be removed while leaving at least a portion of the second semiconductor layer to act as the fin of the device. For example, portions of the second semiconductor layer on laterally opposite sides (referred to here as a "left side" and a "right side") of the first semiconductor layer, that is, those extending in a direction substantially perpendicular to a surface of the substrate, may be left to act as respective fins of the device. As the second semiconductor layer is grown with the first semiconductor layer as a seed, the portions of the second semiconductor layer on the left side and the right side are grown from sidewalls of the first semiconductor layer (or the transition layer) on the left side and the right side thereof respectively, and therefore their crystal structures may be substantially mirror-symmetrical with respect to a center therebetween.

The first semiconductor layer may be physically connected to the substrate through the supporting portion and thus is supported by the substrate. The first semiconductor layer has a portion connected to the supporting portion, which may have an extent, in the longitudinal extending direction of the first semiconductor layer, less than a length of the first semiconductor layer in the longitudinal extending direction. In this way, when the positional relationship among only the first semiconductor layer, the substrate and the supporting portion is observed (without considering other layers), the first semiconductor layer looks like a cantilever, and the supporting portion looks like an anchor of the cantilever.

The supporting portion may comprise a laterally extending portion extending along the surface of the substrate and a vertically extending portion extending in a direction substantially perpendicular to the surface of the substrate. The vertically extending portion extends onto vertical sidewalls of the first semiconductor layer which are substantially perpendicular to the surface of the substrate. In this way, the first semiconductor layer is physically connected to the substrate via the supporting portion and thus is supported by the substrate. The vertically extending portion of the supporting portion may extend on the vertical sidewalls on opposite sides of the first semiconductor layer to sandwich the first semiconductor layer.

The supporting portion may be positioned at either one or both of opposite ends of the fin-shaped first semiconductor layer, or may be positioned in the middle of the fin-shaped first semiconductor layer.

Such a semiconductor device can be manufactured, for example, as follows. Specifically, a fin-shaped structure may be formed on the substrate. After that, when a portion (a "lower portion") of the fin-shaped structure close to the substrate is removed to obtain the first semiconductor layer, the first semiconductor layer may be suspended relative to the substrate.

In order to support the first semiconductor layer which is to be suspended, a supporting portion may be formed. This supporting portion may be formed as follows. Specifically, a supporting layer may be formed on the substrate with the fin-shaped structure formed thereon, and then the supporting layer is patterned into the supporting portion which extends from the surface of the substrate to a surface of the fin-shaped structure and therefore physically connects the fin-shaped structure to the substrate. The supporting layer may be patterned with a mask. The mask extends on the fin-shaped structure beyond an extent of the fin-shaped structure in a direction perpendicular to the longitudinal extending direction of the fin-shaped structure (in this way, the mask can shield portions of the supporting layer extending on the surface of the substrate on opposite sides of the fin-shaped structure, so that those portions can then be remained); and the mask covers only a fraction of a length of the fin-shaped structure in the longitudinal extending direction (in this way, the mask shields only a fraction of the longitudinal extent of the fin-shaped structure, so that this portion can then be connected to the supporting portion). The mask may cover one or both of opposite ends of the fin-shaped structure, or may cover the middle of the fin-shaped structure, and accordingly the resultant supporting portion may be positioned at either one or both of the opposite ends of the fin-shaped structure or the middle of the fin-shaped structure.

After that, the lower portion of the fin-shaped structure may be removed. In this way, the first semiconductor layer looks like a cantilever relative to the substrate, and the supporting portion looks like an anchor of the cantilever to anchor the first semiconductor layer as a cantilever to the substrate.

In order to facilitate removal of the lower portion of the fin-shaped structure, the fin-shaped structure may comprise a stack of sacrificial layer(s) and the first semiconductor layer formed in sequence on the substrate. For example, the sacrificial layer(s) and the first semiconductor layer may be formed in sequence on the substrate, and then patterned into the fin-shaped structure. The patterning step may be carried out into the substrate, so that a protrusion may be formed on the substrate at a position corresponding to the fin-shaped structure. Then, the sacrificial layer(s) may be selectively removed.

As the first semiconductor layer is suspended and thereby surfaces thereof are exposed, (a transition layer and) a second semiconductor layer may be grown on the surfaces. Then, in a case of sufficient growth, all the surfaces of the first semiconductor layer (exposed by the supporting portion) may be covered by the second semiconductor layer.

The first semiconductor layer (and the transition layer, if present) may be removed in at least a fraction of the longitudinal extent while leaving the second semiconductor layer to act as the fin of the device. As the first semiconductor layer (and the transition layer) is surrounded by the second semiconductor layer, in order to facilitate removal of the first semiconductor layer (and the transition layer), the second semiconductor layer may be opened or cut off on one side (referred to here as an "upper side") of the first semiconductor layer away from the substrate, so as to expose (the transition layer and) the first semiconductor layer inside the second semiconductor layer. Openings or cuts in the second semiconductor layer have a dimension sufficient to enable subsequent formation of a gate stack (including a gate dielectric layer, a gate conductor layer and optionally a work function adjustment layer) therethrough. Further, the second semiconductor layer may further be opened or cut off on one side (referred to here as a "lower side") of the first semiconductor layer close to the substrate. In particular, laterally extending portions (those extending in a direction substantially parallel to the surface of the substrate) of the second semiconductor layer on the upper side and the lower side may be removed, so that portions of the second semiconductor layer which are originally located on the laterally opposite sides (i.e., a "left side" and a "right side") of the first semiconductor layer in at least the fraction of the longitudinal extent, that is, those extending in a direction substantially perpendicular to the surface of the substrate, may be remained to act as the fin.

Further, the second semiconductor layer may further be cut off at ends thereof in the longitudinal extending direction of the fin-shaped structure (for example, portions of the second semiconductor layer extending on end faces of the transition layer or the first semiconductor layer in the longitudinal extending direction may be removed), to separate the second semiconductor layer into two portions which are opposite to each other. In a case where the laterally extending portions of the second semiconductor layer on the upper side and the lower side are removed as described above, the remaining portions of the second semiconductor layer at this time extend in a direction substantially perpendicular to the surface of the substrate, which is similar in shape to a conventional fin.

There are various ways to manufacture the device based on the fin. For example, an isolation layer may be formed on the substrate, and a gate stack intersecting the second semiconductor layer or the fin may be formed on the isolation layer.

The present disclosure may be implemented in various forms, and some examples thereof will be described below.

As shown in FIG. 1, a substrate 1001 is provided. The substrate 1001 may be a substrate in any form, for example, but not limited to, a bulk semiconductor substrate such as a bulk Si substrate or the like. Hereinafter, the bulk Si substrate will be described by way of example for convenience of description. In particular, the substrate 1001 may comprise monocrystalline Si, and have a surface of, for example, a (110) crystal face, a (100) crystal face, or a (112) crystal face.

A sacrificial layer 1003 and a first semiconductor layer 1005 are formed in sequence on the substrate 1001 by, for example, epitaxy. The sacrificial layer 1003 may include a different semiconductor material from those of the substrate 1001 and the first semiconductor layer 1005, for example, SiGe (wherein Ge may have an atomic percentage of, for example, about 5-20%), with a thickness of about 10-100 nm. The first semiconductor layer 1005 may include a suitable semiconductor material, such as Si, with a thickness of about 10-100 nm.

Then, the first semiconductor layer 1005 and the sacrificial layer 1003 (and optionally, also the substrate 1001) which are formed in such a way may be patterned to form a fin-shaped structure. For example, this can be done as follows.

Specifically, a hard mask layer may be formed on the first semiconductor layer 1005. In this example, the hard mask layer may comprise an oxide (for example, silicon oxide) layer 1007 and a polysilicon layer 1009. For example, the oxide layer 1007 has a thickness of about 2-10 nm, and the polysilicon layer 1009 has a thickness of about 50-120 nm. In this example, the hard mask is patterned into a fin-like shape using the pattern transfer technology. To this end, patterned (for example, through exposure and development) photoresist PR may be formed on the hard mask layer. Here, the photoresist PR is patterned into a strip extending in a direction perpendicular to the sheet, and may have a width (a dimension in a horizontal direction in the figure) substantially corresponding to a spacing between two fin-shaped structures.

Figure 2:
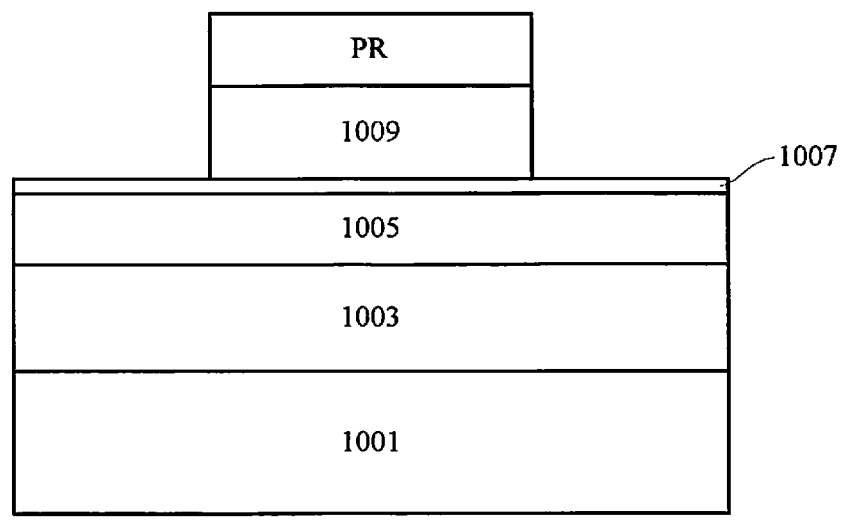
Figure 3A:
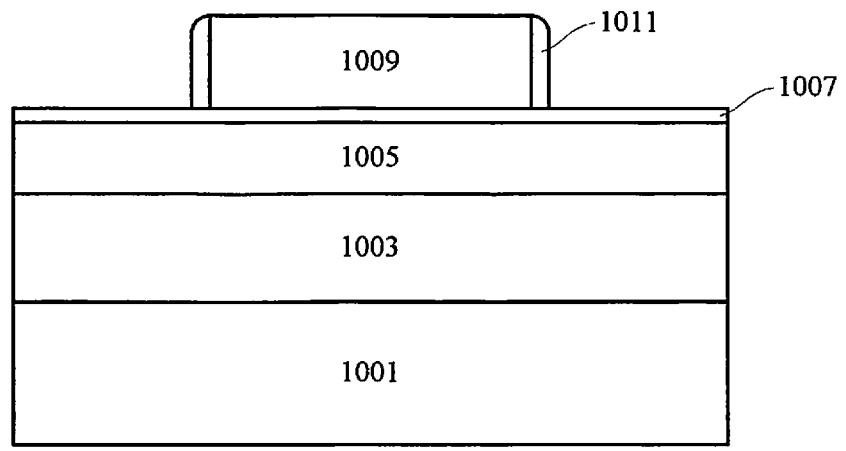

Next, as shown in FIG. 2, the polysilicon layer 1009 is selectively etched (relative to the oxide layer 1007) by, for example, Reactive Ion Etching (RIE) with the photoresist PR as a mask. In this way, the polysilicon layer 1009 may be patterned into a strip corresponding to the photoresist PR. Then, as shown in FIG. 3(a), the photoresist PR is removed and a spacer 1011 is formed on sidewalls of the polysilicon layer 1009. There are various ways in the art to form the spacer. For example, a nitride (for example, silicon nitride) layer with a thickness of, for example, about 3-20 nm may be deposited in a substantially conformal way by, for example, Atomic Layer Deposition (ALD), and then the deposited nitride layer may be selectively etched by, for example, RIE (for example, in a direction substantially perpendicular to the surface of the substrate), to remove a laterally extending portion thereof so that a vertically extending portion thereof is remained to form the spacer 1011.

Figure 3B:
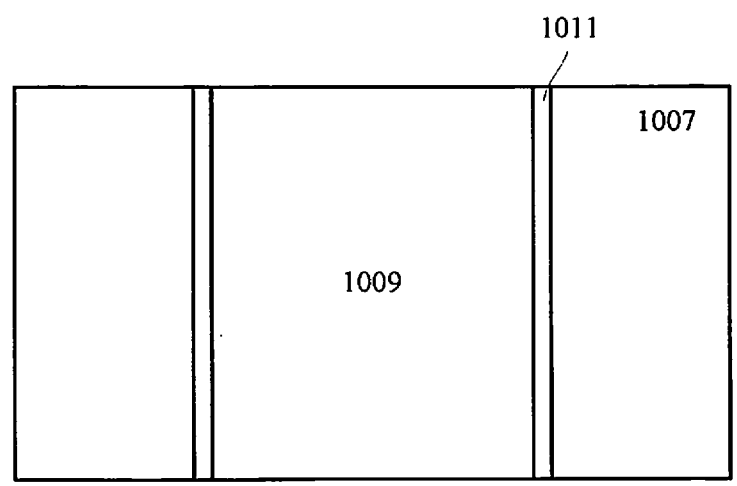

FIG. 3(b) is a top view of the structure shown in FIG. 3(a). It is to be noted that although not shown in FIG. 3(b), the spacer 1011 also exists on upper and lower sidewalls of the strip-shaped polysilicon layer 1009, and thereby the spacer 1011 forms a closed pattern surrounding a periphery of the strip-shaped polysilicon layer 1009.

Figure 4A:
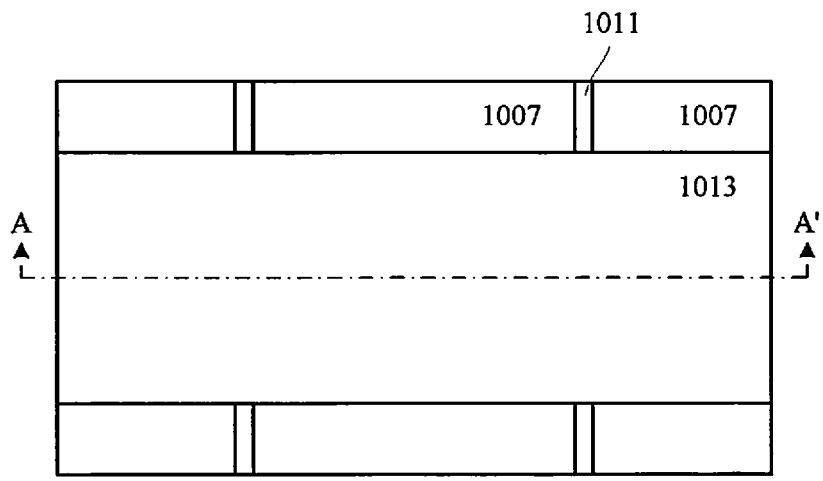
Figure 4B:
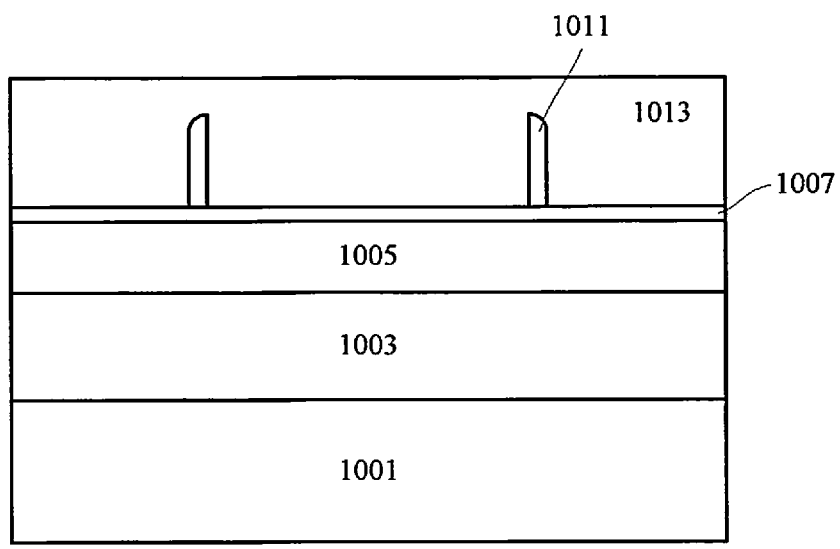
Figure 5:
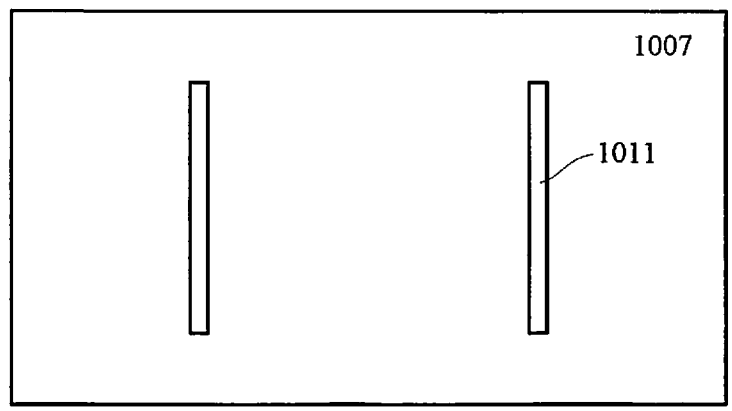

In order to obtain a fin-shaped mask, as shown in FIGS. 4(a) and 4(b) (FIG. 4(a) is a top view, and FIG. 4(b) is a sectional view taken along line AA' in FIG. 4(a)), the polysilicon layer 1009 may be selectively removed (by, for example, a Tetramethylammonium hydroxide (TMAH) solution) and then a patterned photoresist 1013 is formed. The photoresist 1013 may shield the middle of the spacer 1011 and expose upper and lower portions of the spacer 1011. The spacer 1011 may be selectively etched by, for example, RIE, with the photoresist 1013 as a mask, so that the spacer 1011 which is originally in the closed pattern can be separated into two portions, as shown in FIG. 5. Each of the portions corresponds to a fin-shaped structure to be formed, which in this example is a strip extending in a vertical direction in the figure.

Figure 6:
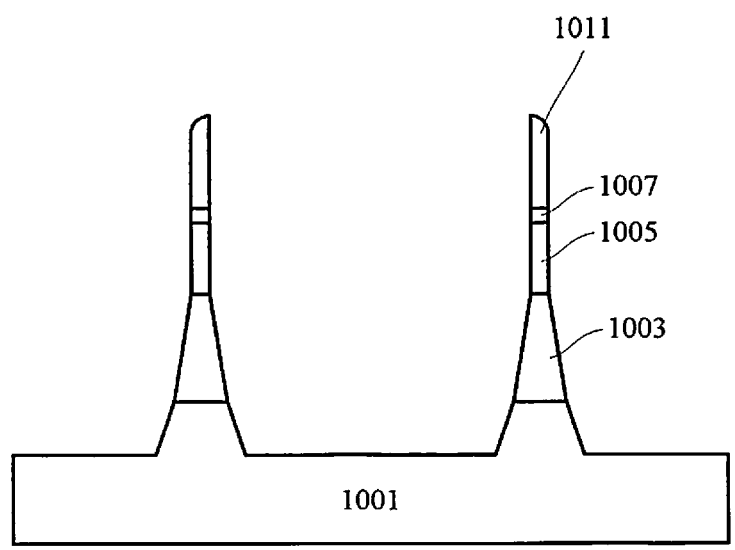

Then, as shown in FIG. 6, the oxide layer 1007, the first semiconductor layer 1005, and the sacrificial layer 1003 may be selectively etched in sequence by, for example, RIE, with the spacer 1011 as a mask. In this way, the pattern of the spacer 1011 is transferred into the underlying layers, resulting in the fin-shaped structures. Therefore, the first semiconductor layer 1005 has a width (a dimension in a horizontal direction in the figure) which is substantially the same as that of the spacer 1011 (for example, about 3-20 nm). The sidewalls (the sidewalls on left and right sides in the figure) of the first semiconductor layer 1005 may be (111) or (110) crystal faces, which help reducing growth defects.

Here, the substrate 1001 may be further selectively etched. Therefore, the substrate 1001 may have a protrusion thereon at a position corresponding to the fin-shaped structure. The fin-shaped structure has a projection on the substrate at substantially the middle of the protrusion. Due to characteristics of etching, the sacrificial layer 1003 after being etched and the protrusion of the substrate 1001 each may have a shape increasingly enlarged from top down. Then, the spacer 1011 may be selectively removed (and the oxide layer 1007 may be further selectively removed).

Although the fin-shaped structure is formed by the pattern transfer technology as described above, the present disclosure is not limited thereto. For example, fin-shaped photoresist may be formed directly on the first semiconductor layer 1005, and the first semiconductor layer 1005, the sacrificial layer 1003 and the substrate 1001 may be selectively etched with the photoresist as a mask to form a fin-shaped structure. Alternatively, fin-shaped photoresist may be formed directly on the hard mask layer, the hard mask layer may be patterned into a fin-like shape by using the photoresist, and the first semiconductor layer 1005, the sacrificial layer 1003 and the substrate 1001 may be selectively etched in sequence with the fin-shaped hard mask layer to form a fin-shaped structure.

Here, although two fin-shaped structures are illustrated, the present disclosure is not limited thereto. For example, more or less fin-shaped structures may be formed. Further, a layout of the fin-shaped structures may be differently designed according to requirements for the device.

Figure 7:
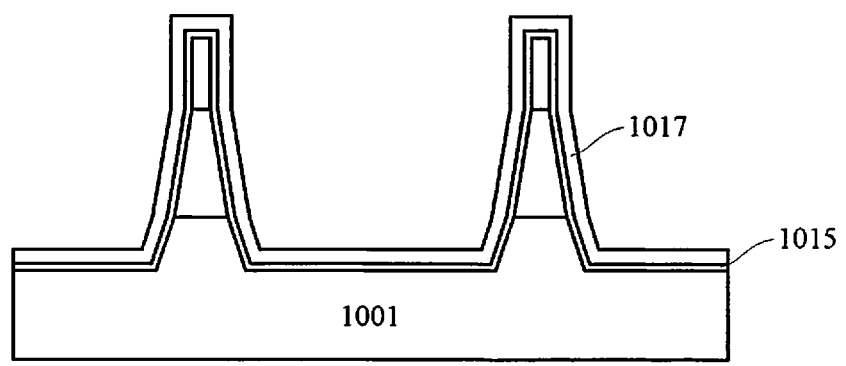

After the fin-shaped structures are formed, a supporting portion may be formed. For example, as shown in FIG. 7, an oxide layer 1015 and a nitride layer 1017 may be formed by, for example, ALD in a substantially conformal way on the substrate with the fin-shaped structures formed thereon. The oxide layer 1015 may have a thickness of about 1-10 nm, and the nitride layer 1017 may have a thickness of about 2-15 nm. Then, as illustrated in the top view of FIG. 8, patterned photoresist 1019 may be formed on the structure illustrated in FIG. 7. The photoresist 1019 is patterned to cover an end (a lower end in the figure) of the fin-shaped structures and extend in a horizontal direction in the figure. It is to be noted here that in the top view of FIG. 8, the topography of the nitride layer 1017 which fluctuates along with the fin-shaped structures on the substrate is not shown merely for convenience, and the same is true for the following top views.

Figure 9A:
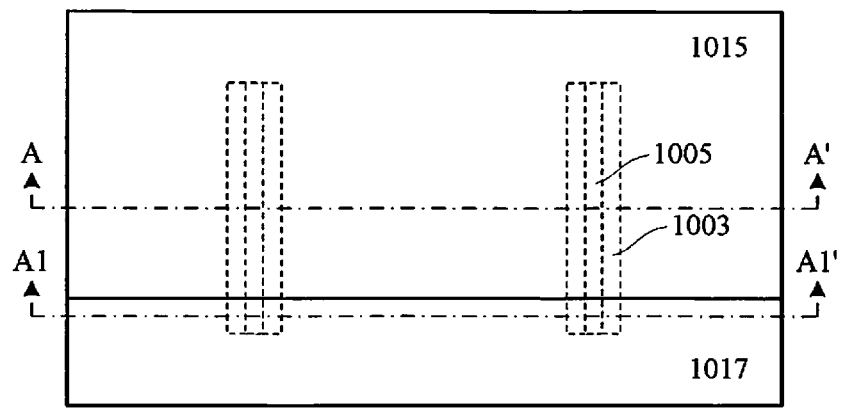
Figure 9B:
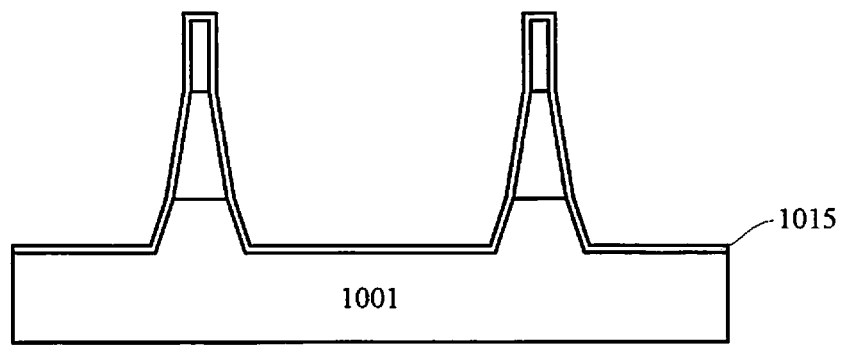
Figure 9C:
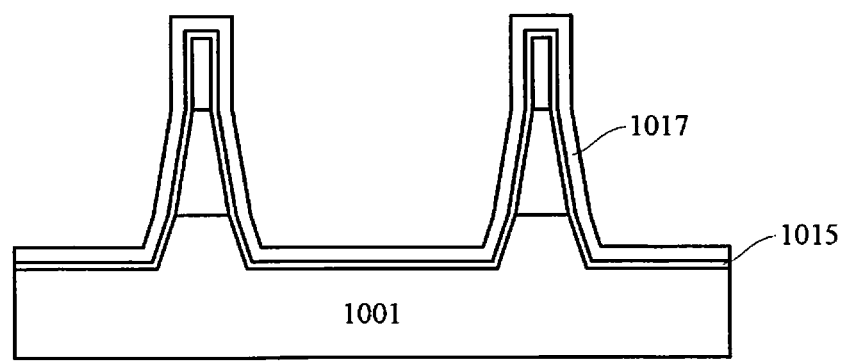

Then, as shown in FIGS. 9(a), 9(b) and 9(c) (FIG. 9(a) is a top view, FIG. 9(b) is a sectional view along line AA' in FIG. 9(a), and FIG. 9(c) is a sectional view along line A1A1' in FIG. 9(a)), the nitride layer 1017 is selectively removed by, for example, RIE (relative to the oxide layer 1015) with the photoresist 1019 as a mask. In this way, as shown in FIG. 9(c), the nitride layer 1017 is remained at an end (a lower end in FIG. 9(a)) of the fin-shaped structures and extends onto the surface of the substrate 1001. In this way, the fin-shaped structures are physically connected to the substrate 1001 by the nitride layer 1017, and thus can be supported by the substrate 1001 (particularly after the sacrificial layer 1003 is removed as described below). Then, the photoresist 1019 may be removed.

In the present embodiment, a supporting layer which is a stack of the oxide layer and the nitride layer is formed, and the supporting layer is patterned into a supporting portion. However, the present disclosure is not limited thereto. The supporting layer may comprise various suitable dielectric materials. In an embodiment in which the supporting portion is subsequently removed, the supporting layer may even comprise a semiconductor material or a conductive material.

Figure 10:
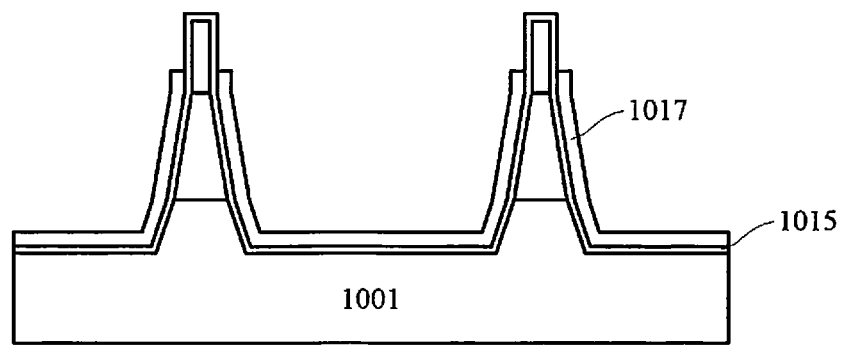

Further, as shown in FIG. 10 (a sectional view corresponding to that of FIG. 9(c)), a top portion of the nitride layer 1017 may further be selectively removed by, for example, RIE (relative to the oxide layer 1015). However, these is still a portion of the nitride layer 1017 remained on sidewalls of the first semiconductor layer 1005, so as to subsequently support the first semiconductor layer 1005.

Figure 11A:
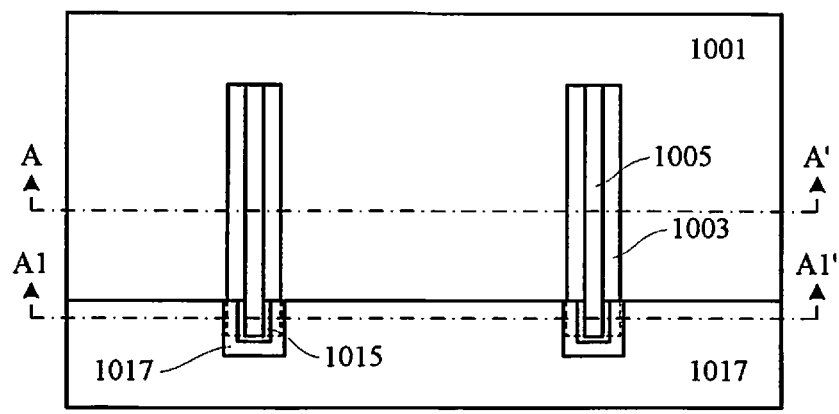
Figure 11B:
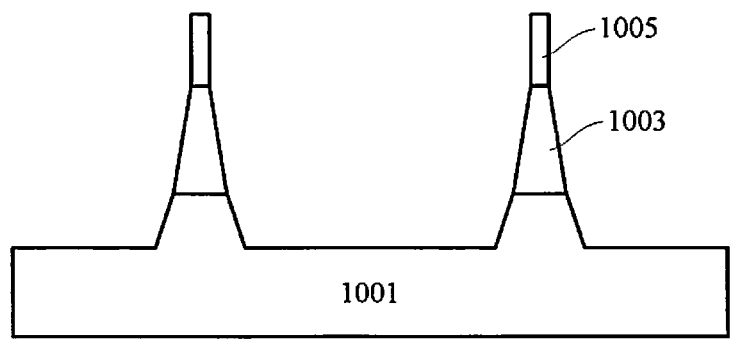
Figure 11C:
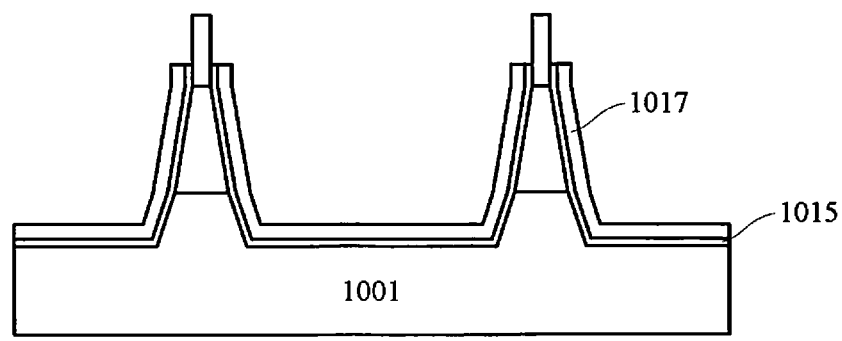
Figure 12A:
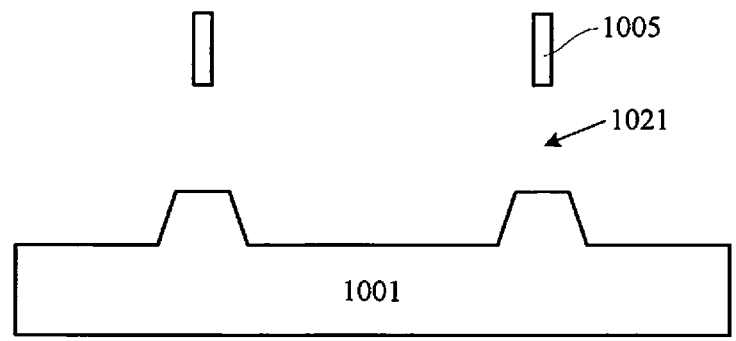
Figure 12B:
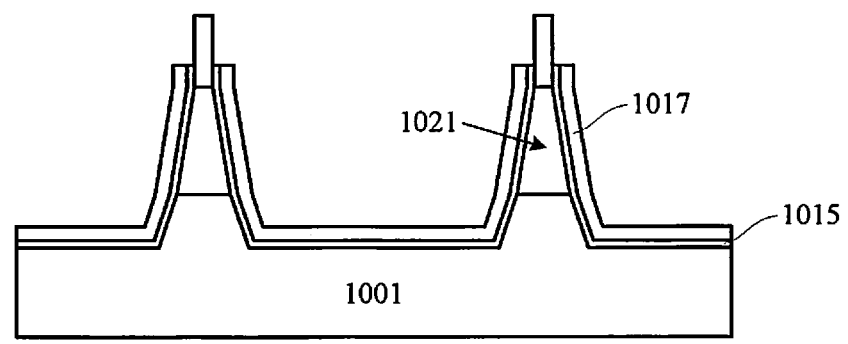

Then, as shown in FIGS. 11(a), 11(b) and 11(c) (FIG. 11(a) is a top view, FIG. 11(b) is a sectional view taken along line AA' in FIG. 11(a), and FIG. 11(c) is a sectional view taken along line A1A1' in FIG. 11(a)), the oxide layer 1015 may be selectively removed by, for example, RIE (relative to the substrate 1001 and the first semiconductor layer 1005 of Si and the sacrificial layer 1003 of SiGe). As shown in FIGS. 11(a) and 11(c), the oxide layer 1015 is covered by the nitride layer 1017 and thus may be remained at an end (for example, a lower end in FIG. 11(a)) of the fin-shaped structure. Then, as shown in FIGS. 12(a) and 12(b) (sectional views corresponding to those of FIGS. 11(b) and 11(c), respectively), the sacrificial layer 1003 may be selectively removed by, for example, wet etching (relative to the substrate 1001 and the first semiconductor layer 1005 of Si). In this way, spacing 1021 between the fin-shaped first semiconductor layer 1005 and the substrate 1001 is formed.

Figure 13:
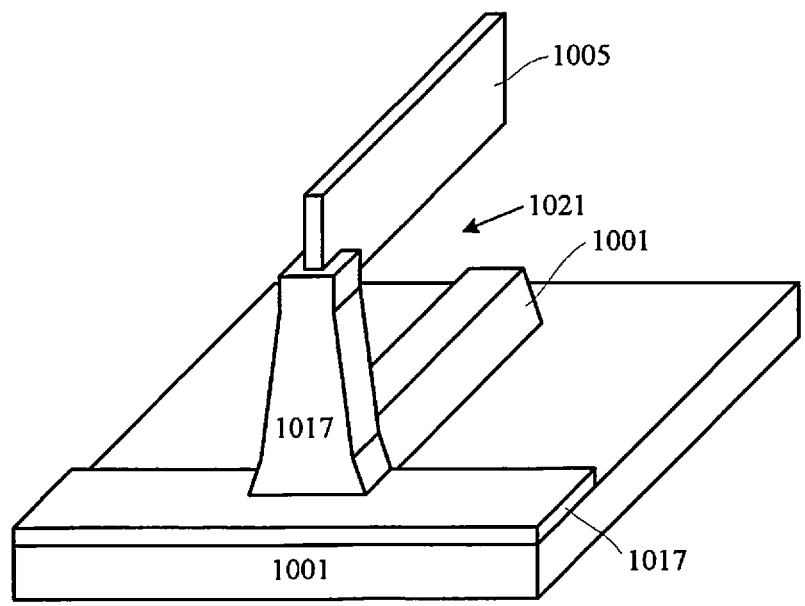

FIG. 13 illustrates a perspective view of the structure shown in FIG. 12. As shown in FIG. 13, the first semiconductor layer 1005 is spaced apart from the substrate 1001 by the spacing 1021, extend substantially in parallel to the surface of the substrate, and is supported by the substrate 1001 through the supporting portion 1015/1017. For example, in a case where the surface of the substrate is a (110) crystal face, the first semiconductor layer 1005 may have an extending direction parallel to an intersection line between a (110) crystal face and a (1-11) crystal face or an intersection line between a (110) crystal face and a (1-1-1) crystal face or an intersection line between a (110) crystal face and a (-111) crystal face, and the first semiconductor layer 1005 may have a side surface substantially parallel to a (111) crystal face family. Alternatively, in a case where the surface of the substrate is a (112) crystal face, the first semiconductor layer 1005 may have an extending direction parallel to an intersection line between a (112) crystal face and a (-1-11) crystal face or an intersection line between a (112) crystal face and a (11-1) crystal face, and the first semiconductor layer 1005 may have a side surface also substantially parallel to the (111) crystal face family. Alternatively, the first semiconductor layer 1005 may have an extending direction corresponding to a <110> direction, and in a case where the surface of the substrate is a (100) crystal face, the first semiconductor layer 1005 may have a side surface substantially parallel to a (110) crystal face. These crystal faces help reducing growth defects.

In FIG. 13, for convenience merely, only one single first semiconductor layer 1005 and the corresponding supporting portion are shown, and the residual portion of the oxide layer 1015 is not shown.

The supporting portion 1015/1017 comprises a laterally extending portion which extends on the surface of the substrate 1001 and a vertically extending portion which extends in a direction substantially perpendicular to the surface of the substrate. In this example, the vertically extending portion may comprise a portion extending along surfaces of the protrusion of the substrate 1001, a portion extending along surfaces of the sacrificial layer 1003 (which has been removed) and also a portion extending along the vertical sidewalls of the first semiconductor layer 1005. In this way, the supporting portion 1015/1017 physically connects the first semiconductor layer 1005 to the substrate 1001, and thus can support the first semiconductor layer 1005. The supporting portion 1015/1017 may extend on the vertical sidewalls of the first semiconductor layer 1005 on opposite sides (left side and right side in the figure), so as to sandwich the first semiconductor layer, thereby more stably supporting the first semiconductor layer 1005. Of course, in this example, the supporting portion 1015/1017 further extends on a sidewall at an end of the first semiconductor layer 1005 facing the readers. A portion of the first semiconductor layer 1005 connected to the supporting portion 1015/1017 has an extent in a longitudinal extending direction of the first semiconductor layer 1005 which is less than a length of the first semiconductor layer 1005 in the longitudinal extending direction. Here, the so-called "longitudinal extending direction" refers to a lengthwise direction of the first semiconductor layer 1005 (a direction perpendicular to the sheet in FIG. 12), which is substantially the same as a length direction of a channel which is then formed, that is, a direction from a source to a drain, and vice versa. In this way, the first semiconductor layer 1005 looks like a cantilever relative to the substrate 1001, and the cantilever is anchored to the substrate 1001 by the supporting portion 1015/1017.

In the above example, in addition to the nitride layer 1017, the supporting portion further comprises the oxide layer 1015. However, the present disclosure is not limited thereto. For example, in the processes described above in conjunction with FIG. 7, the oxide layer 1015 may not be formed, and instead, the nitride layer 1017 is directly formed. In this way, subsequent processes may also be implemented in the manner described above in conjunction with FIGS. 8-12. Of course, the supporting portion may also comprise other dielectric material(s) or a different stack.

In addition, in the above example, for the two fin-shaped structures, the supporting portion is formed at their respective lower ends. However, the present disclosure is not limited thereto. For example, for one of the fin-shaped structures, the supporting portion may be formed at its lower end, as described above; and for the other of the fin-shaped structures, the supporting portion may be formed at a different position, for example, at its upper end, as described above.

Figure 8:
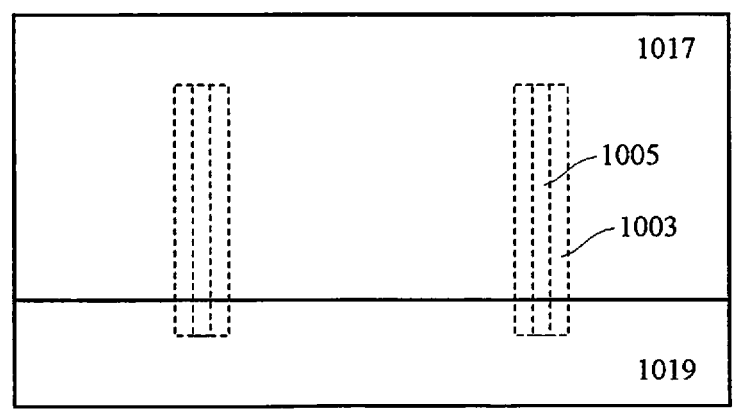

In addition, the mask 1019 which is used to pattern the supporting portion (as shown in FIG. 8) is not limited to the above shape. Generally, the mask may extend on the fin-shaped structure beyond an extent of the fin-shaped structure in a direction perpendicular to the longitudinal extending direction of the fin-shaped structure. In this way, the mask may cover a portion of the nitride layer 1017 extending on the surface of the substrate 1001 (other than the protrusion), and thus this portion can then be remained (as a base of the supporting portion). On the other hand, the mask may cover only a fraction of the length of the fin-shaped structure in the longitudinal extending direction. In this way, a cantilever-anchor like structure may be formed.

Then, as shown in FIGS. 14(*a*) and 14(*b*) (sectional views corresponding to those of FIGS. 12(*a*) and 12(*b*), respectively), a second semiconductor layer 1025 may be grown on the first semiconductor layer 1005. Here, the second semiconductor layer 1025 may comprise a material of high mobility, for example, Ge, SiGe, or a III-V compound semiconductor, such as InSb, InGaSb, InAs, GaAs, InGaAs, AlSb, InP, group-III nitride or the like, with a thickness of about 5-15 nm. In a case of the compound semiconductor such as SiGe, components thereof (for example, an atomic percentage of Ge) may change gradually, so that the compound semiconductor has a lattice constant which changes from being quite similar to that of the first semiconductor layer 1005 (here, Si) to being more different from that of the first semiconductor layer 1005, to suppress dislocations or defects. The second semiconductor layer 1025 may have a side surface substantially parallel to the (111) crystal face family or the (110) crystal face family of the substrate.

Further, as described above, a transition layer 1023 may firstly be grown on the first semiconductor layer 1005, and then the second semiconductor layer 1025 may be grown on the transition layer 1023. The transition layer 1023 may comprise various suitable semiconductor materials, for example, Ge, SiGe or a III-V compound semiconductor, such as InSb, InGaSb, InAs, GaAs, InGaAs, AlSb, InP, group-III nitride or the like, with a thickness of about 1-20 nm. The transition layer 1023 may comprise the same material as or a different material from that of the second semiconductor layer 1025.

The growth may be selective growth, so that the transition layer 1023 is grown on the surfaces of the first semiconductor layer 1005 (and also the substrate 1001) of the semiconductor material, and the second semiconductor layer 1025 is grown on surfaces of the transition layer 1023 of the semiconductor material. The growth of the transition layer 1023 and the second semiconductor layer 1025 may be controlled so that the transition layer 1023 and the second semiconductor layer 1025 do not completely fill the spacing 1021 between the first semiconductor layer 1005 and the substrate 1001. Due to the suspension configuration of the first semiconductor layer 1005, stresses in the first semiconductor layer 1005, the transition layer 1023 and the second semiconductor layer 1025 can be relaxed in the growth process. In this way, it is possible to suppress or even avoid defects occurring in the first semiconductor layer 1005, the transition layer 1023 or the second semiconductor layer 1025, which contributes to improve performances of the device (for example, reduce an off-state leakage current or increase an on-state current).

In this example, except for surfaces of the first semiconductor layer 1005 covered by the supporting portion 1015/1017, remaining surfaces of the first semiconductor layer 1005 are covered by the transition layer and the second semiconductor layer. Of course, the transition layer 1023 and the second semiconductor layer 1025 may also be grown on the surface of the substrate 1001.

In this example, there is a longitudinal extent of the first semiconductor layer in the longitudinal extending direction thereof which is not occupied by the supporting portion, peripheries of which are completely enclosed by the transition layer 1023, and in which extent peripheries of the transition layer 1023 are completely enclosed by the second semiconductor layer 1025. In this way, in a cross section perpendicular to the longitudinal extending direction of the first semiconductor layer 1005 (i.e., the cross section illustrated in FIGS. 14(a) and 14(b)), the transition layer 1023 forms a closed pattern (which is a rectangle in this example), and the second semiconductor layer forms a closed pattern (which is a rectangle in this example). Of course, the closed patterns are decided by a pattern of the first semiconductor layer 1005 in the cross section, and may be in a different shape such as a polygon.

The second semiconductor layer 1025 may then act as a fin of the device. According to an embodiment of the present disclosure, the transition layer 1023 and the first semiconductor layer 1005 may be removed while leaving at least a portion (for example, portions on left and right sides in FIG. 14(a)) of the second semiconductor layer 1025 to act as the fin.

Figure 14A:
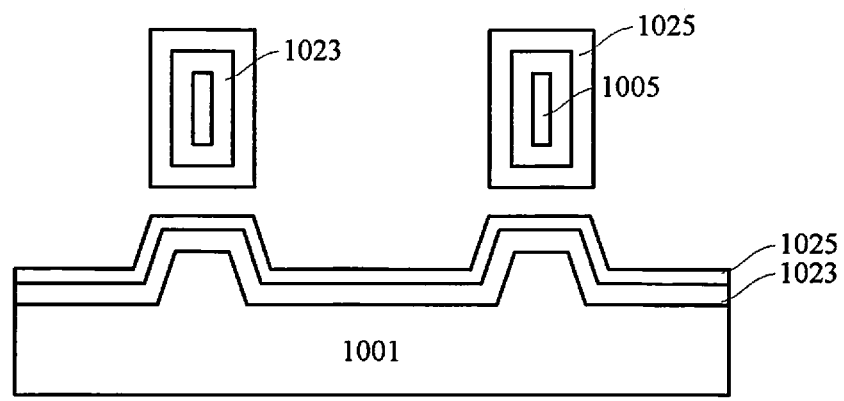
Figure 14B:
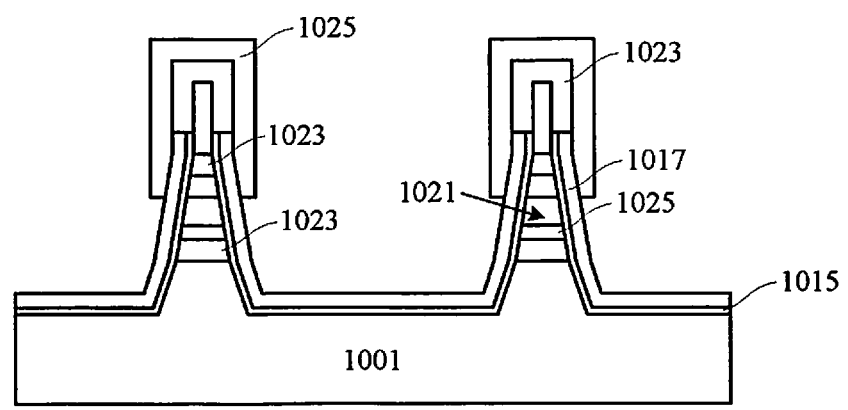
Figure 15:
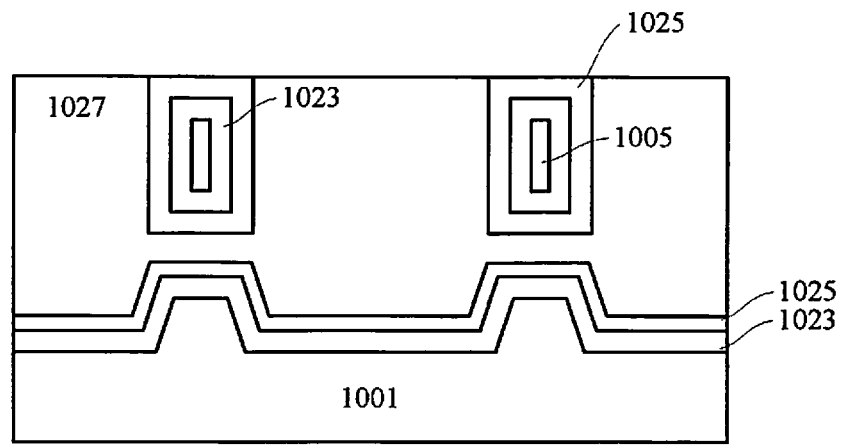

To this end, as shown in FIG. 15 (a sectional view corresponding to that of FIG. 14(a)), a dielectric layer 1027 may be formed on the structure shown in FIG. 14 by, for example, deposition, and may be etched back until the second semiconductor layer 1025 is exposed. The dielectric layer 1027 may be planarized by, for example, Chemical Mechanical Polishing (CMP), before the back-etching. Alternatively, the planarization process may stop at the second semiconductor layer 1025, so that no further back-etching is required. For example, the dielectric layer 1027 may include oxide (for example, silicon oxide).

Figure 16:
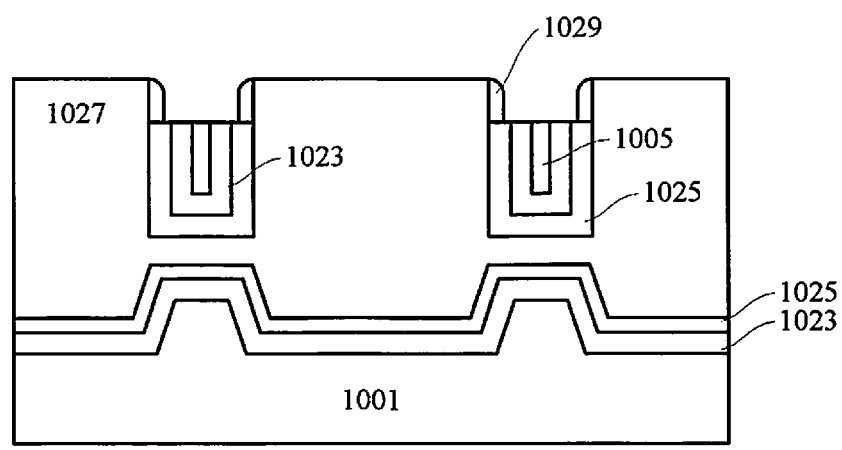

Then, as shown in FIG. 16, portions of the layers above the first semiconductor layer 1005 may be removed. For example, the transition layer 1023 and the second semiconductor layer 1025 may be etched back by ME (in which an etching recipe capable of etching both the transition layer 1023 and the second semiconductor layer 1025 may be selected) until the first semiconductor layer 1005 is exposed. Thus, a recess is formed in the dielectric layer 1027 due to such back-etching. A mask layer 1029 in a form of spacer may be formed on sidewalls of such a recess. For example, a nitride layer (with a thickness of, for example, about 3-15 nm) may be deposited in a substantially conformal way, and then a laterally extending portion of the nitride layer may be removed by RIE while leaving a vertically extending portion of the nitride layer. Thereby, the spacer 1029 is formed on inner walls of the recess. Here, the spacer 1029 may cover at least a portion of the second semiconductor layer 1025 without covering the first semiconductor layer 1005 and the transition layer 1023. The mask layer 1029 is formed in such a way that sidewalls of the mask layer 1029 can be self-aligned to sidewalls of the second semiconductor layer 1025.

Figure 17:
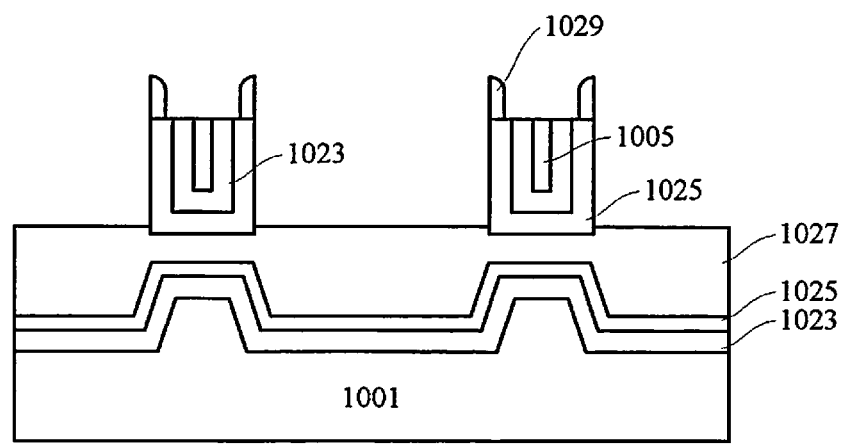

Next, as shown in FIG. 17, the dielectric layer 1027 may be etched back (by, for example, wet etching or vapor etching). Here, the dielectric layer 1027 may be etched back, so that the dielectric layer 1027 has its top surface close to but higher than a bottom surface of the second semiconductor layer. For example, the top surface of the dielectric layer 1027 is between the bottom surface of the second semiconductor layer and a bottom surface of the transition layer 1023. This is to reduce a difference in height between different portions of the top surface of the dielectric layer 1027 (for example, a difference in height between a portion of the top surface of the dielectric layer 1027 underlying the second semiconductor layer 1025 and the remaining portions of the top surface of the dielectric layer 1027), so as to subsequently obtain an isolation layer having a top surface at substantially the same level.

Figure 18:
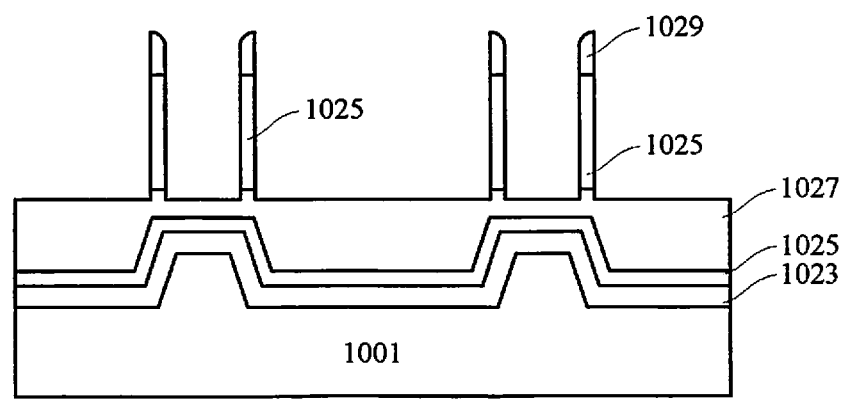

Then, as shown in FIG. 18, the semiconductor layer (including the first semiconductor layer 1005, the transition layer 1023, and the second semiconductor layer 1025) may be selectively etched by, for example, RIE, using the mask layer 1029. Thus, upper and lower sides of the second semiconductor layer 1025 are opened. The dielectric layer 1027 may then be further etched back by, for example, RIE, so that the dielectric layer 1027 is lower than the bottom surface of the second semiconductor layer 1025. As the difference in height between the different portions of the top surface of the dielectric layer 1027 has been reduced as described above, the top surface of the dielectric layer 1027 (except for the portions of the dielectric layer 1027 underlying the second semiconductor layer 1025, which may abut the bottom surface of the second semiconductor layer 1025) may be at substantially the same level after the further back-etching. The dielectric layer 1027 may act as an isolation layer. The mask layer 1029 may then be removed.

As shown in FIG. 18, a fin 1025 is formed on the substrate (more specifically, on the isolation layer 1027). The fin 1025 extends in a direction substantially perpendicular to the surface of the substrate.

Figure 19:
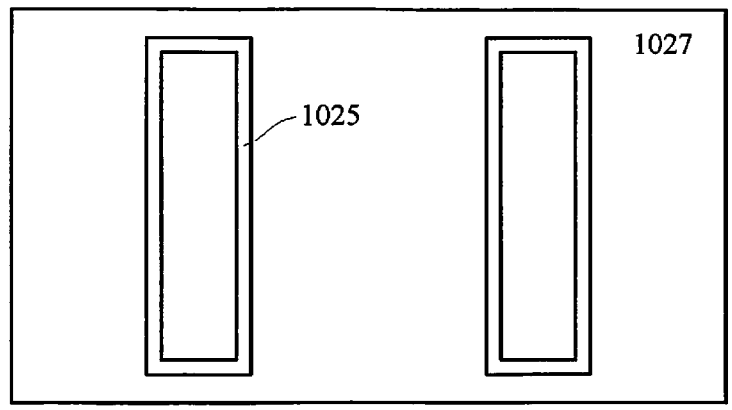
Figure 20:
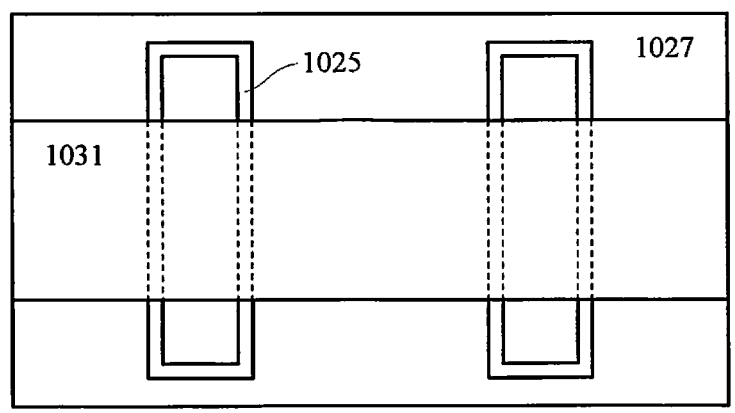

As the second semiconductor layer 1025 is formed around the first semiconductor layer, the fin 1025 may still be in a closed shape at this time in the top view as shown in FIG. 19. It is to be noted that in FIG. 19, the residual portion of the supporting portion is not shown for convenience only. This fin in the closed shape may be cut off to form separate fins. For example, as shown in FIG. 20, the middle of the second semiconductor layer 1025 may be shielded by a mask (for example, photoresist) 1031, to expose ends thereof (upper and lower ends in the figure). Then, the second semiconductor layer 1025 may be selectively etched by, for example, RIE. Thus, the exposed ends of the second semiconductor layer 1025 are removed, thereby resulting in separated fins as shown in FIG. 21 (a). For a pair of fins on the left side, the fins are grown along the sidewalls of the same first semiconductor layer 1005, and therefore extend substantially parallel to each other. As described above, as the fins are grown from the same first semiconductor layer 1005, they may be mirror-symmetrical in the crystal structure with respect to a central line therebetween. The same is true for a pair of fins on the right side.

It is to be noted here that the second semiconductor layer 1025 may not be cut off, and instead, may be maintained to still have the closed shape as shown in FIG. 20. In this case, source/drain regions of devices formed based on the pair of fins on the left side are connected to each other, and source/drain regions of devices formed based on the pair of fins on the right side are connected to each other.

Figure 21A:
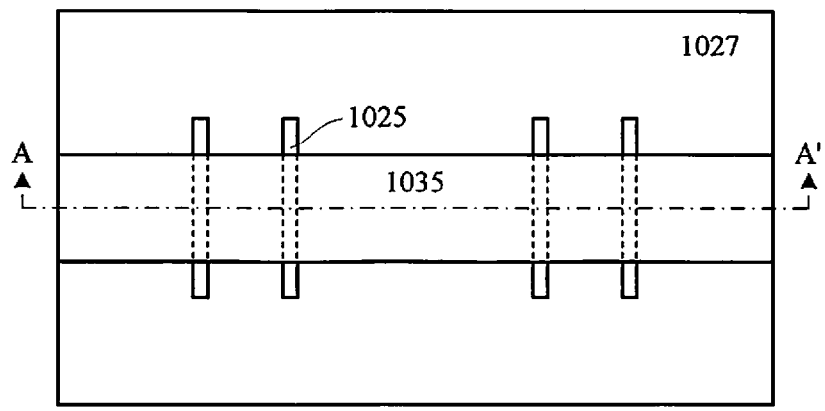
Figure 21B:
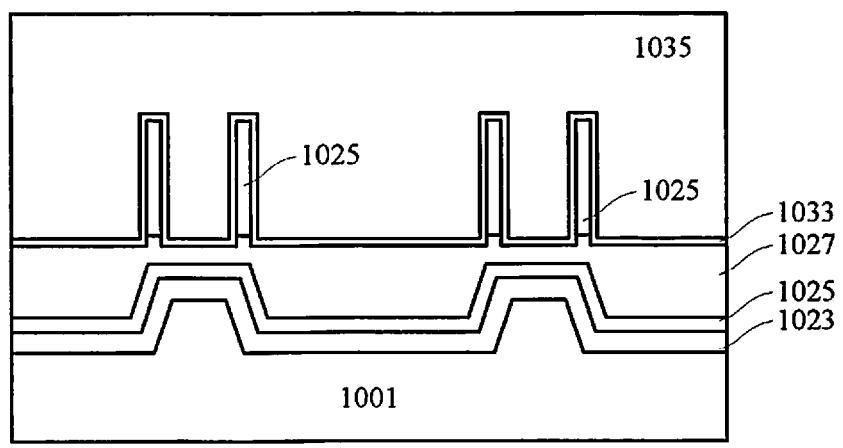

After the fin 1025 is formed by the above processes, a gate stack intersecting the fin may be formed, resulting in the final semiconductor device (for example, FinFET). As shown in FIGS. 21(a) and 21(b) (FIG. 21(a) is a top view, and FIG. 21(b) is a sectional view taken along line AA' of FIG. 21(a)), a gate stack intersecting the fin 1025 may be formed on the isolation layer 1027. For example, a gate dielectric layer 1033 and a gate conductor layer 1035 may be formed in sequence. For example, the gate dielectric layer 1033 may comprise oxide (for example, $SiO_2$ or $GeO_2$) with a thickness of about 0.3-2 nm, and the gate conductor layer 1035 may comprise polysilicon. Alternatively, the gate dielectric layer 1033 may comprise a high-K gate dielectric such as $HfO_2$ or $Al_2O_3$ with a thickness of about 1-4 nm, and the gate conductor layer 1035 may comprise a metallic gate conductor. In a case of high-K gate dielectric/metallic gate conductor, a work function adjustment layer (not shown), for example, TiN, Al, Ti, TiAlC, with a thickness of about 1-3 nm may be further formed between the gate dielectric layer 1033 and the gate conductor layer 1035.

In this example, gate stacks of devices corresponding to the respective fins are shown to have the same configuration and extend as a whole, for convenience of illustration only. However, the present disclosure is not limited thereto. The devices may have different gate stack configurations (for example, a gate stack of an n-type device may be different from that of a p-type device), and the respective gate stacks may be patterned according to a layout of the devices.

After the gate stack is formed, halo implantation and extension implantation may be performed with the gate stack as a mask, for example. Next, a gate spacer may be formed on sidewalls of the gate stack. Then, source/drain (S/D) implantation may be performed with the gate stack and the gate spacer as a mask. Then, implanted ions may be activated through annealing to form source/drain regions.

Those skilled in the art are aware of various ways to manufacture a device based on a fin, and processes after formation of the fin will not be described in detail here.

In this way, the semiconductor device according to the present embodiment is obtained. As shown in FIGS. 21(*a*) and 21(*b*), the semiconductor device may comprise at least two fins 1025 spaced apart from the substrate 1001. At least a pair of adjacent ones (for example, a pair of fins on the left side or a pair of fins on the right side in the figure) of these fins may be arranged in a direction substantially parallel to the surface of the substrate, spaced apart from each other, and extend substantially parallel to each other, and may be substantially mirror-symmetrical in the crystal structure with respect to a central line therebetween. Further, the pair of fins may be symmetrical with respect to a line which is substantially perpendicular to the surface of the substrate and passes through the center of a corresponding protrusion on the substrate. In addition, the device also comprises the isolation layer 1027 and the gate stack (1033 and 1035) formed on the isolation layer 1027 and intersecting the fin 1025.

In the present embodiment, the supporting portion is not intentionally removed. However, the present disclosure is not limited thereto. The supporting portion may be selectively (at least partially) removed (for example, after the gate stack is formed), and a space resulting from the removal of the supporting portion may be filled with, for example, another dielectric layer.

Figure 22:
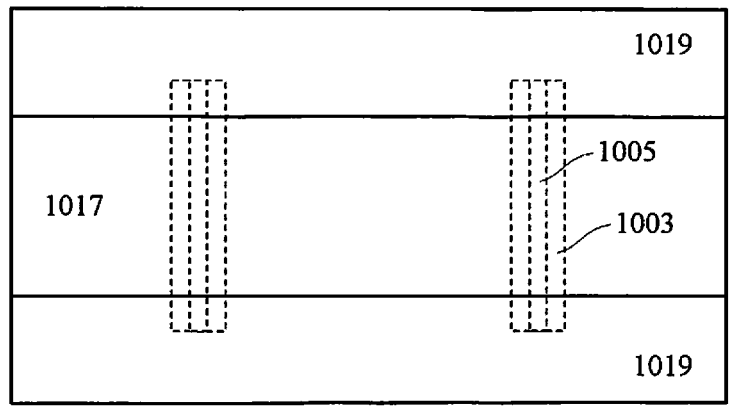
FIGS. 22-23 are schematic views showing some stages in a flow of manufacturing a semiconductor device according to a further embodiment of the present disclosure.
Figure 23:
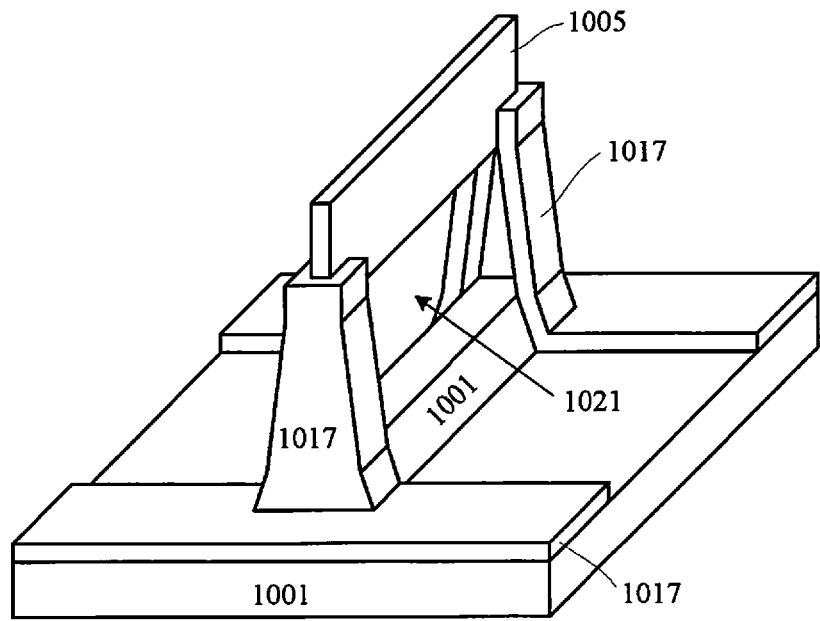

In the above embodiment, the supporting portion is formed only at one end of the first semiconductor layer. However, the present disclosure is not limited thereto. The supporting portion may be formed at opposite ends of the first semiconductor layer. For example, instead of the operation described above in connection with FIG. 8, as shown in FIG. 22, the photoresist 1019 is patterned to cover opposite ends (upper and lower ends in the figure) of the fin-shaped structure and extend in a horizontal direction in the figure. Subsequent operations may be performed in the same manner as described above. In this case, a suspension structure shown in FIG. 23 may be obtained. In particular, as shown in FIG. 23, the first semiconductor layer 1005 is suspended relative to the substrate 1001, and opposite ends of the first semiconductor layer 1005 are supported by the substrate 1001 through the supporting portion 1017.

Figure 24:
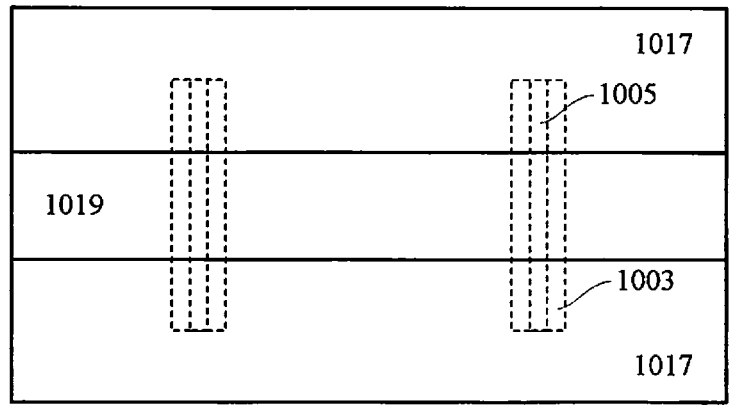
FIGS. 24-25 are schematic views showing some stages in a flow of manufacturing a semiconductor device according to a still further embodiment of the present disclosure.
Figure 25:
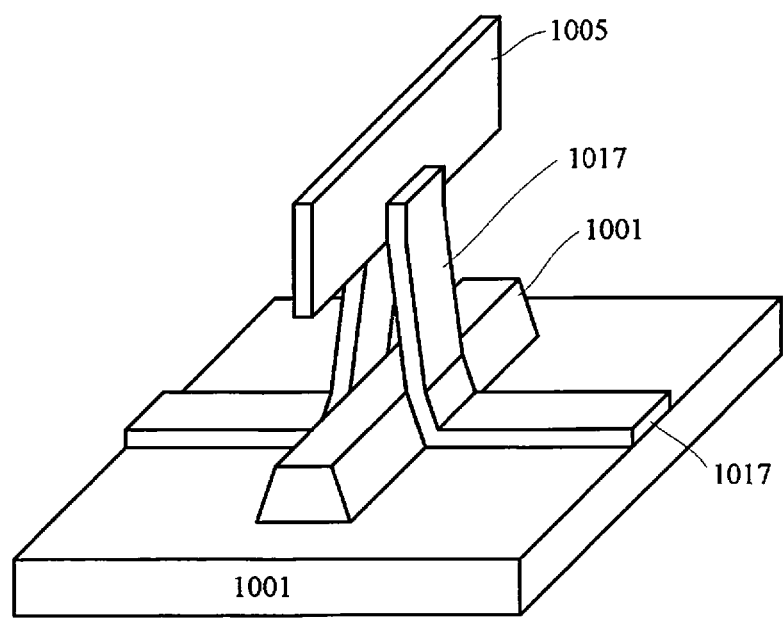

Of course, the supporting portion is not limited to be formed at the end(s) of the first semiconductor layer, and instead, may be formed at any position in the longitudinal extent of the first semiconductor layer. For example, instead of the operation described above in connection with FIG. 8, as shown in FIG. 24, the photoresist 1019 is patterned to cover the middle of the fin-shaped structure and extend in a horizontal direction in the figure. Subsequent operations may be performed in the same manner as described above. In this case, a suspension structure shown in FIG. 25 may be obtained. In particular, as shown in FIG. 25, the first semiconductor layer 1005 is suspended relative to the substrate 1001, and the middle of the first semiconductor layer 1005 is supported by the substrate 1001 through the supporting portion 1017.

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

The invention claimed is:

1. A method of manufacturing a semiconductor device, comprising:
    forming a fin-shaped structure on a substrate, wherein the fin-shaped structure longitudinally extends on the substrate in a first direction substantially parallel to a surface of the substrate;
    forming a supporting layer on the substrate having the fin-shaped structure formed thereon, and patterning the supporting layer into a supporting portion extending from the surface of the substrate to a surface of the fin-shaped structure and thus physically connecting the fin-shaped structure to the substrate;

removing a portion of the fin-shaped structure close to the substrate to form a first semiconductor layer spaced apart from the substrate;

growing a second semiconductor layer with the first semiconductor layer as a seed layer;

etching the second semiconductor layer on a side of the first semiconductor layer away from the substrate to form, in the second semiconductor layer, an opening extending substantially in the first direction, to expose the first semiconductor layer on the side;

etching the first semiconductor layer through the opening; and etching the second semiconductor layer on a side of the first semiconductor layer close to the substrate through the opening to form, in the second semiconductor layer, a further opening extending substantially in the first direction, resulting in a first portion of the second semiconductor layer extending substantially in the first direction and a second portion of the second semiconductor layer extending substantially in the first direction, which are spaced apart from each other by the opening and the further opening and each act as a fin of the semiconductor device.

2. The method according to claim 1, wherein the first portion and the second portion of the second semiconductor layer each vertically extend with respect to the surface of the substrate.

3. The method according to claim 1, wherein the etching of the second semiconductor layer on the side of the first semiconductor layer away from the substrate comprise:

forming a dielectric layer on the substrate, and etching back the dielectric layer until the second semiconductor layer is exposed;

etching back the second semiconductor layer to expose the first semiconductor layer;

wherein the etching of the first semiconductor layer comprises:

forming a mask layer on the second semiconductor layer to shield at least a portion of the second semiconductor layer while exposing the first semiconductor layer; and selectively etching the first semiconductor layer using the mask layer, and wherein the etching of the second semiconductor layer on the side of the first semiconductor layer close to the substrate comprises selectively etching the second semiconductor layer using the mask layer.

4. The method according to claim 1, further comprising:

growing a transition layer on the first semiconductor layer, wherein the second semiconductor layer is grown on the transition layer, wherein the etching of the first semiconductor layer further comprise etching the transition layer through the opening.

5. The method according to claim 4, wherein the etching of the second semiconductor layer on the side of the first semiconductor layer way from the substrate comprise:

forming a dielectric layer on the substrate, and etching back the dielectric layer until the second semiconductor layer is exposed;

etching back the second semiconductor layer and the transition layer to expose the first semiconductor layer;

wherein the etching of the first semiconductor layer comprises:

forming a mask layer on the second semiconductor layer to shield at least a portion of the second semiconductor layer while exposing the transition layer and the first semiconductor layer; and selectively etching the first semiconductor layer using the mask layer, wherein the etching of the transition layer comprises electively etching the transition layer using the mask layer, and wherein the etching of the second semiconductor layer on the side of the first semiconductor layer close to the substrate comprises selectively etching the second semiconductor layer using the mask layer.

6. The method according to claim 3, wherein the forming of the mask layer comprises:

forming the mask layer in a form of spacer on inner walls of a recess in the dielectric layer due to the back-etching of the second semiconductor layer.

7. The method according to claim 3, wherein the method further comprises, after the forming of the mask layer and before the selective etching, etching back the dielectric layer in such a way that the dielectric layer has its top surface at a level still higher than a bottom surface of the second semiconductor layer.

8. The method according to claim 7, wherein the dielectric layer is etched back in such a way that the dielectric layer has its top surface at a level lower than a bottom surface of the first semiconductor layer in contact with the second semiconductor layer.

9. The method according to claim 7, wherein the method further comprises, after the selective etching, further etching back the dielectric layer, so that the dielectric layer has its top surface at a level lower than the bottom surface of the second semiconductor layer.

10. The method according to claim 9, further comprising: forming a gate stack on the further etched-back dielectric layer to intersect the fin.

11. The method according to claim 1, wherein the fin-shaped structure comprises a stack of a sacrificial layer and the first semiconductor layer formed in sequence on the substrate.

12. The method according to claim 11, wherein the removing of a portion of the fin-shaped structure close to the substrate comprises selectively removing the sacrificial layer.

13. The method according to claim 1, wherein the patterning of the supporting portion comprises:

forming a mask to shield a portion of the supporting layer, wherein the mask extends on the fin-shaped structure beyond an extent of the fin-shaped structure in a direction perpendicular to the first direction, and the mask covers only a fraction of a length of the fin-shaped structure in the first direction;

selectively removing portions of the supporting layer which are not shielded; and removing the mask.

14. The method according to claim 13, wherein the method further comprises, after the removing of the mask, selectively removing a top portion of the supporting portion to expose a top surface and a portion of sidewalls of the fin-shaped structure.

15. The method according to claim 13, wherein the forming of the mask comprises:

covering either one or both of opposite ends of the fin-shaped structure with the mask or covering the middle of the fin-shaped structure with the mask.

16. The method according to claim 1, wherein the forming of the supporting layer comprises:

depositing an oxide layer and a nitride layer in sequence in a substantially conformal way.

17. The method according to claim 1, wherein the first semiconductor layer has a side surface of a crystal face or a crystal face.

\* \* \* \* \*